United States Patent [19]

Kuroda et al.

[11] Patent Number: 5,636,997
[45] Date of Patent: Jun. 10, 1997

[54] CONNECTION APPARATUS OF CIRCUIT BOARD

[75] Inventors: Kazunori Kuroda, Ibaraki-ken; Tomohiro Saitsu, Kasukabe, both of Japan

[73] Assignees: Hitachi Maxell, Ltd., Osaka; Rios Systems Co., Ltd., Kanagawa-ken, both of Japan

[21] Appl. No.: 267,936

[22] Filed: Jul. 6, 1994

[30] Foreign Application Priority Data

Jul. 6, 1993 [JP] Japan .................................. 5-166823

[51] Int. Cl.$^6$ ................................................ H01R 9/09
[52] U.S. Cl. ........................... 439/74; 439/217; 361/790; 361/803
[58] Field of Search .................... 439/74, 217, 218, 439/954; 361/684, 686, 784, 785, 790, 791, 803

[56] References Cited

U.S. PATENT DOCUMENTS

| 3,838,315 | 9/1974 | Wilbourn ........................... 361/803 |
| 4,122,313 | 10/1978 | De Luca ............................ 439/218 |
| 5,171,154 | 12/1992 | Casciotti et al. .................... 439/62 |
| 5,289,339 | 2/1994 | Akashi et al. ...................... 439/924.1 |
| 5,387,110 | 2/1995 | Kantner et al. ..................... 439/218 |
| 5,404,268 | 4/1995 | O'Connor ........................... 439/217 |

FOREIGN PATENT DOCUMENTS 356757  3/1990  European Pat. Off. ............ 439/217

*Primary Examiner*—Gary F. Paumen
*Attorney, Agent, or Firm*—Birch, Stewart, Kolasch & Birch, LLP

[57] ABSTRACT

A connection apparatus of a circuit board having high operability and high reliability. In a connection apparatus constructed of a first circuit board and a second circuit board detachably connected via a connector to the first circuit board, the second circuit board can be mounted with respect to the first circuit board along not only the normal direction, but also the reverse direction. Also, even when the second circuit board is mounted on the first circuit board along either the normal direction, or the reverse direction, both of the first and second circuit boards can be operated under the normal condition.

2 Claims, 5 Drawing Sheets

CONNECTION APPARATUS OF CIRCUIT BOARD

BACKGROUND OF THE INVENTION

The present invention generally relates to a connection apparatus of a circuit board, which is applicable to, for instance, a connection of an extendible internal memory employed in a personal computer. More specifically, the present invention is directed to a connection apparatus of a circuit board, having high operability and high reliability.

Very recently, personal computers have been considerably, widely utilized in various fields. The process contents of these personal computers depend upon various needs of users, and thus the systems have been established such that the internal memory may be extended in response to user requests.

Figure 11:
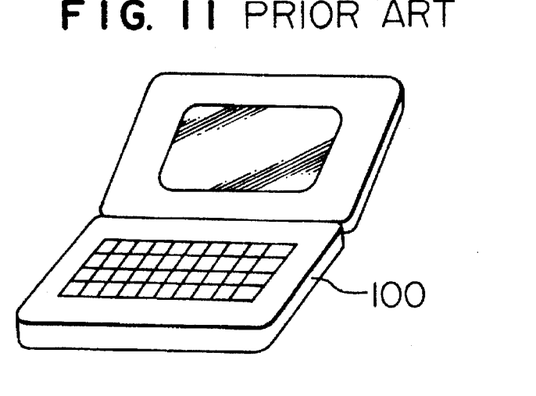
FIG. 11 is a perspective view of a notebook type personal computer.
Figure 12:
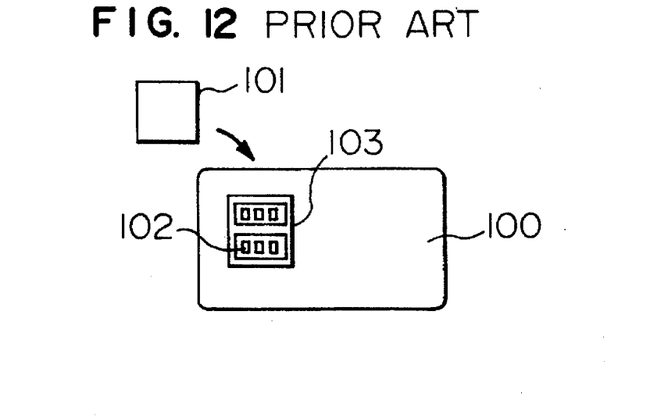
FIG. 12 is a bottom view for showing the notebook type personal computer of FIG. 11.

For instance, in case of a notebook type personal computer as illustrated in FIG. 11 and FIG. 12, a concave 103 used to mount an extendible internal memory 102 is provided on the lower surface of a personal computer body 100 when a lid 101 is opened, so that the extendible internal memory 102 which is necessary to execute manage data process can be substituted.

Figure 13:
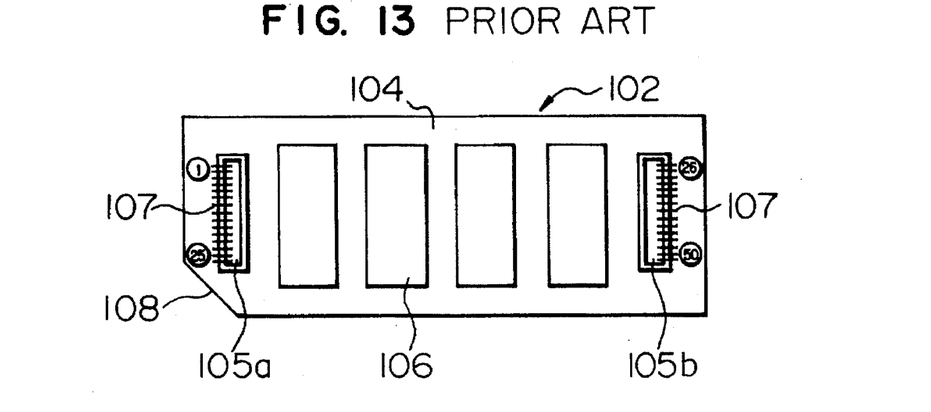
FIG. 13 is a bottom view for indicating the conventional extendible internal memory.

FIG. 13 is a bottom view of the conventional extendible internal memory 102. As shown in FIG. 13, female connectors 105a and 105b are provided on both sides of a printed board 104 in parallel to each other, and a plurality of IC memory chips 106 are arranged between the connectors 105a and 105b.

A large number of terminal pins 107 are fixed on the connectors 105a and 105b in order to be connected to a printed board (not shown) of the personal computer body 100. For example, when the total number of terminal pins 107 is 50, the terminal pins 107 numbered from 1 to 25 are fixed to the left-sided connector 105a (as viewed in FIG. 13), are also the terminal pins 107 numbered from 26 to 50 are fixed to the right-sided connector 105b, so that these terminal pins 107 are connected to the IC memory chips 106.

To define the mounting direction of the extendible internal memory 102 with respect to the personal computer body 100, a notch portion 108 is formed at one corner of the printed board 104, and furthermore another notch portion is formed on the above-described concave 103 of the personal computer body 100 in correspondence with this notch portion 108.

While this extendible internal memory 102 is overlapped on the printed board employed in the personal computer body 100, the female connectors 105a and 105b provided on the extendible internal memory 102 are fitted to the male connectors of the personal computer body 100, so that this extendible internal memory 102 is electrically connected to the personal computer body 100. As a result, the memories are extendably provided.

However, if the above-described conventional extendible internal memory 102 would be inserted into the personal computer body 100 along the incorrect insertion direction, then the connectors 105a and 105b would be mechanically destroyed. As a result, there are many possibilities that the memories could not be extendably provided.

Since there is a risk that the electric circuits employed in the personal computer body 100 are electrically destroyed (mainly shortcircuited) when the extendible internal memory 102 would be inserted into the personal computer body 100 along the incorrect direction, a protection circuit for preventing such a shortcircuit is required.

SUMMARY OF THE INVENTION

An object of the present invention is to solve the above-described conventional drawbacks, and to provide a connection apparatus of a circuit board, with having high operability and high reliability.

To achieve the above-explained object, according to one aspect of the present invention, in a connection apparatus comprising a first circuit board, for instance, a printed board employed in a personal computer, and a second circuit board, for example, a printed board employed in an extendible internal memory, detachably mounted via a connector to said first circuit board, said second circuit board can be mounted with respect to said first circuit board along not only a normal direction, but also a reverse direction opposite to said normal direction by 180°, and even when the second circuit board is mounted with regard to the first circuit board along either said normal direction, or said reverse direction, said first and second circuit boards can be operated under normal condition.

To achieve the above-explained object, according to another aspect of the present invention, in a connection apparatus comprising a first circuit board, for instance, a printed board employed in a personal computer, and a second circuit board, for example, a printed board employed in an extendible internal memory, detachably mounted via a connector to said first circuit board, the second circuit board can be mounted with respect to the first circuit board along not only the normal direction, but also the reverse direction; and even when said second circuit board is mounted with respect to said first circuit board along either the normal direction, or the reverse direction, substantially same electric circuits are formed between said first circuit board and said second circuit board.

To achieve the above-mentioned object, according to a further aspect of the present invention, in a connection apparatus comprising a first circuit board, for instance, a printed board employed in a personal computer, and a second circuit board, for example, a printed board employed in an extendible internal memory, detachably mounted via a connector to said first circuit board, at least two connectors are provided on each of said first circuit board and said second circuit board; and at least one of said two connectors of at least one of said first and second circuit boards are displaceable along an interval direction of said two connectors provided on the same board.

As previously explained, according to one aspect of the present invention, it is so arranged that the second circuit board can be mounted with respect to the first circuit board along not only the normal direction, but also the reverse (opposite) direction, and even when the second circuit board is mounted with regard to the first circuit board along either the normal direction, or the reverse direction, the first and second circuit boards can be operated under normal condition. As a result, the second circuit board can be mounted without paying attention to the mounting direction thereof, whereby operabilities of these circuit boards can be improved. Conventionally, the mounting direction of the second circuit board with respect to the first circuit board must be considered while mounting the second circuit board on the first circuit board.

Since even when the second circuit board is mounted with respect to the first circuit board along either the normal direction, or the reverse direction, the normal electric circuit can be formed, no longer is a protection circuit such as employed in prior art required.

As previously explained, in accordance with another aspect of the present invention, it is so constructed that the circuit board along not only the normal direction, but also the reverse direction opposite to this normal direction, and even when the second circuit board is mounted with regard to the first circuit board along either the normal direction, or the reverse direction, the substantially same electric circuits can be formed between the first circuit board and the second circuit board. As a consequence, since the second circuit board is mounted on the first circuit board by varying the mounting direction, so that at least two same electric circuits can be formed, even if either contact failure, or disconnection happens to occur in the contacts of one electric circuit, the other electric circuit can be normally operated, resulting in improving operation reliability.

As previously stated, in accordance with a still further aspect of the present invention, at least two connectors are employed in each of the first circuit board and the second circuit board, and then at least one connector employed in at least one of these first and second circuit boards is displaceable along the interval direction of the connectors. As a consequence, even when there is a slight positional shift in the connector mounting position (interval) and the component dimension, such a positional shift can be absorbed. Therefore, there is advantage that mechanical destruction of the connectors and contact failure of the connector pins can be prevented.

DESCRIPTION OF THE PREFERRED EMBODIMENTS

Figure 1:
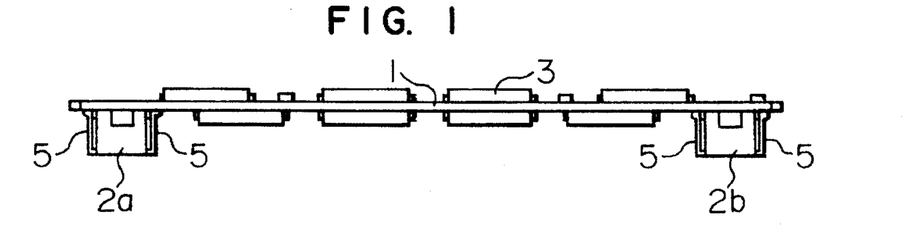
FIG. 1 is a front view of an extendible internal memory according to an embodiment of the present invention.
Figure 2:
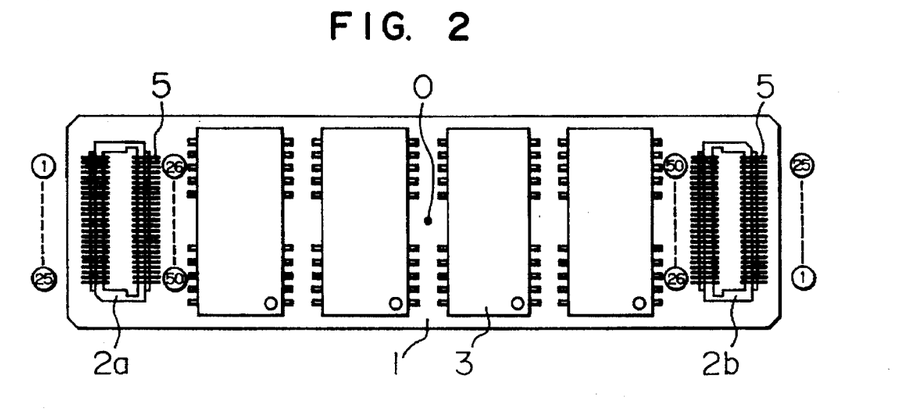
FIG. 2 is a bottom view of the extendible internal memory according to the embodiment.
Figure 3:
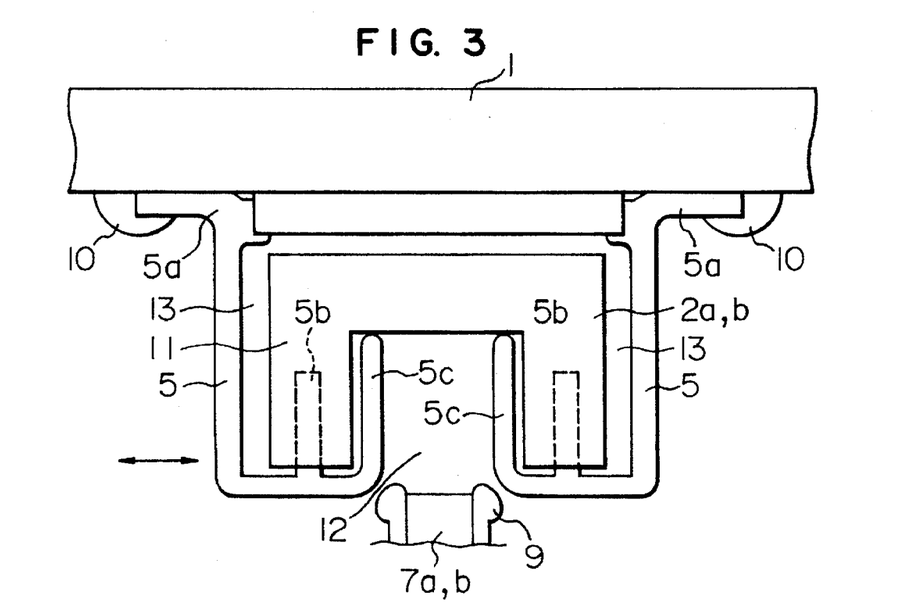
FIG. 3 is an enlarged front view of a connector of the extendible internal memory according to the embodiment.

A description will now be made of a connecting apparatus for a circuit board according to an embodiment of the present invention with reference to the drawings. FIG. 1 is a front view of an extendible internal memory according to an embodiment of the present invention. FIG. 2 is a bottom view of this extendible internal memory. FIG. 3 is an enlarged front view of a connector used to this extendible internal memory.

As illustrated in FIG. 1 and FIG. 2, female connectors 2a and 2b are positioned in parallel to each other on both sides of a lower surface of a printed board 1. A plurality of IC memory chips 3 and the like are mounted on the upper surface of the printed board 1 and between the connectors 2a and 2b.

A large number of terminal pins 5 are fixed to the connectors 2a and 2b, which are used to be connected with a printed board 4 (see FIG. 4B) of a main body of a personal computer. When the total number of terminal pins 5 is selected to be, for instance, 50, the terminal pins 5 numbered by 1 to 25 are fixed on the left column side of the left-sided connector 2a and also on the right column side of the right-sided connector 2b, as illustrated in FIG. 2. Then, the terminal pins 5 numbered by 26 to 50 are fixed on the right column side of left-sided connector 2a and also on the left column side of the right-sided connector 2b. These 50 terminal pins 5 are connected to the IC memory chip 3 and the like. In other words, the terminal pins 5 numbered by 1 to 25 and the terminal pins 5 numbered by 26 to 50 provided on the respective female connectors 2a and 2b are arranged in a point symmetry with respect to a center point "0" between the connectors 2a and 2b as a base point.

Figure 4A:
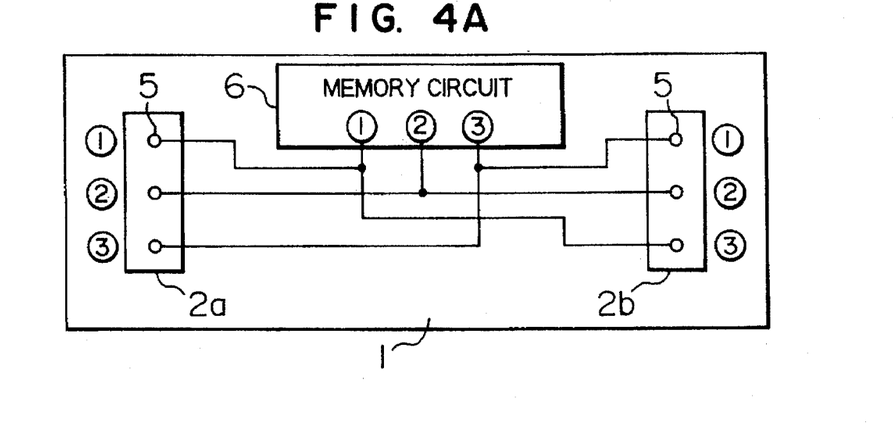
FIGS. 4A and 4B schematically show connection diagrams of two printed boards to be connected, according to the embodiment.
Figure 4B:
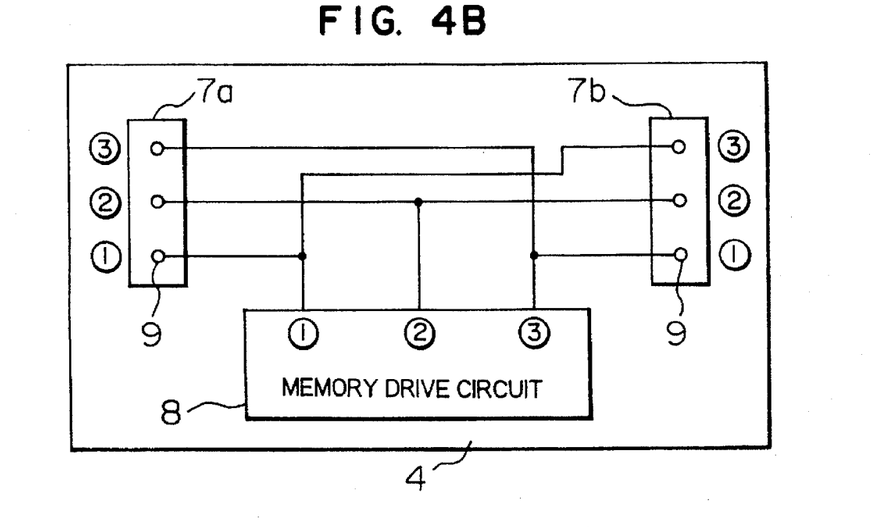

FIGS. 4A and 4B schematically indicate simplified circuit diagrams of the print board 1 for the extensible internal memory, and the print board 4 for the main body of the personal computer. On the print board 1, a memory circuit 6 is arranged by a plurality of IC memory chips 3 and the like, and the left-sided connector 2a is connected with the right-sided connector 2b on this print board 1, as represented in FIG. 4A.

On the other hand, there are provided a male connector 7a fitted to the above-described female connector 2a, and another male connector 7b fitted to the above-explained female connector 2b on the printed board 4. Further, as represented in FIG. 4B, a memory drive circuit 8 is provided in between these male connectors 7a and 7b, and is connected to terminal pins 9 of these right and left male connectors 7a and 7b.

In other words, on the printed board 1, the terminal pin (1) of the left-sided female connector 2a is connected via, for instance, the terminal (1) of the memory circuit 6 to the terminal pin (3) of the right-sided female connector 2b, and more over both of these terminal pins (1,3) are arranged in such a point symmetry with respect to the terminal (1) of the memory circuit 6. On the printed board 4, the terminal pin (1) of the left-sided male connector 7a is connected via, for example, the terminal (1) of the memory drive circuit 8 to the terminal pin (3) of the right-sided male connector 7b, and both these terminal pins (1,3) are arranged in a point symmetry with respect to the terminal of the memory drive circuit 8.

As a result, even when the female connectors 2a and 2b of the printed board 1 are connected to the male connectors 7a and 7b of the printed board 4 along either the normal direction, or the direction reversed by 180° with respect to the normal direction, the respective terminals (1), (2), (3) corresponding to the memory drive circuit 8 are connected with the terminals (1), (2), (3) of the memory circuit 6.

FIG. 3 schematically shows a structure of the connectors 2a and 2b. Arrays of terminal pins 5 having elasticity are positioned opposite to each other at preselected positions of the printed board 1. A base portion 5a of each terminal pin 5 is connected to a terminal land portion of the printed board 1 by way of solder 10. An intermediate portion 5b of the terminal pin 5 is press-fitted into a main body 11 of the female connector made of a synthetic resin, and a tip portion 5c of the terminal pin 5 is extended within a groove 12 of this main body 11 of the female connector.

As a result, the main body 11 of the female connector is held by the terminal pin 5, and spaces 13 are formed among the both side surfaces thereof and the terminal pin 5, so that this main body 11 may be slightly displaceable along the space direction (arrow direction) of the connectors 2a and 2b.

As illustrated in FIG. 3, the male connector 7a and 7b are fitted into the groove portion 12 of the main body 11 for the female connector, so that the terminal pin 5 is electrically connected to the terminal pin 9.

In FIGS. 4A and 4B, for instance, when the female connector 2a is fitted with the male connector 7a, and the female connector 2b is fitted with the male connector 7b, or even when the female connector 2a is fitted with the male connector 7b, and the female connector 2b is fitted with the male connector 7a in accordance with a mounting direction opposite to the first-mentioned mounting direction, the memory circuit 6 may be correctly connected to the memory drive circuit 8, and moreover two sets of the same electric circuits may be constituted between the printed boards 1 and 4.

Figure 5:
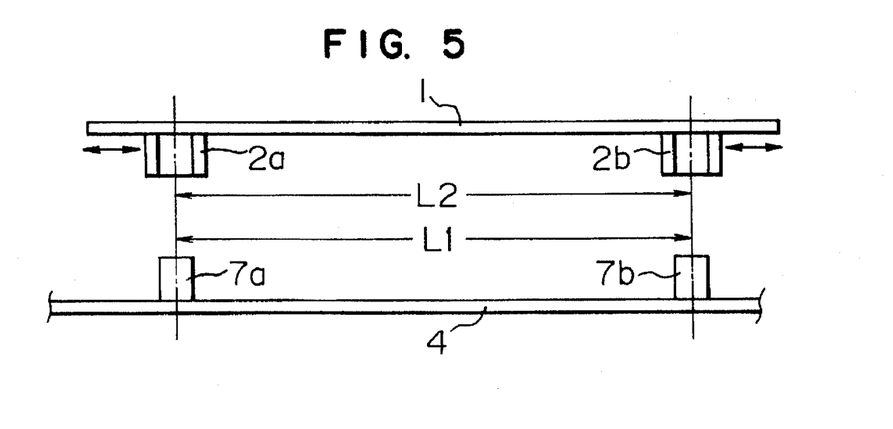
FIG. 5 is a front view for schematically represents a corresponding relationship of the two printed boards shown in FIG. 4.

As represented in FIG. 5, although an interval "L2" between the female connectors 2a and 2b of the printed board 1 is so designed to be equal to an interval "L1" between the male connectors 7a and 7b of the printed board 4, there are some possibilities that the lengths of the intervals L1, L2, the positions of these connectors 2 and 7, and degrees of parallelism between the connectors 2a and 2b, or between the connectors 7a and 7b actually represent incorrect values due to fluctuation in component dimensions and mounting positions.

As a consequence, when the connectors 2 and 7 would be fixed to the printed boards 1 and 4 in order that these connectors are not positionally shifted, these connectors would be deformed, or broken if these connectors would be fitted to each other. To avoid such a damage, in accordance with the present invention, as described above, the female connectors 2a and 2b are slightly displaceable along the space directions (arrow directions), whereby this structure may absorb the shifts occurred in the intervals L1 and L2.

Figure 6:
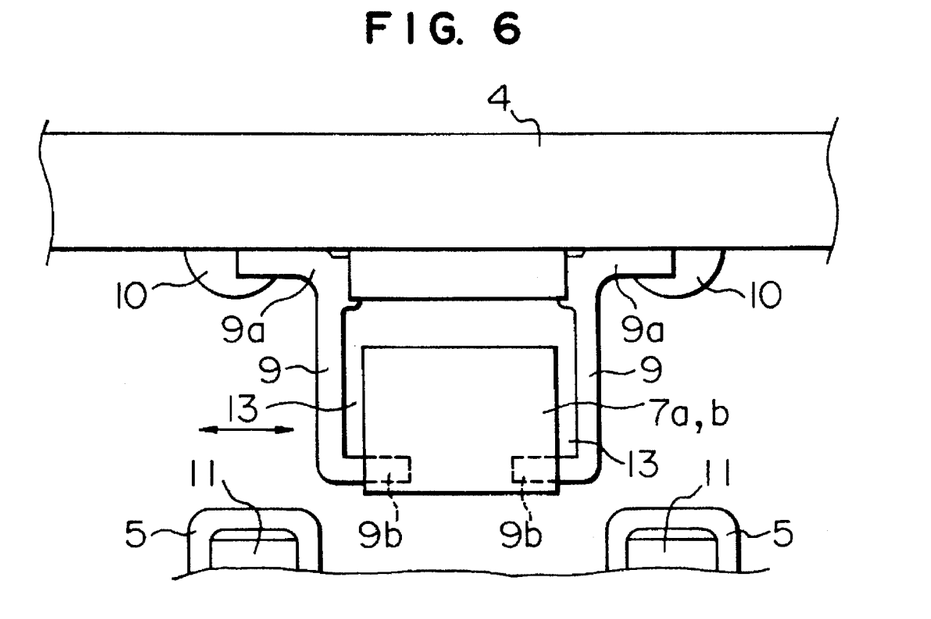
FIG. 6 is an enlarged front view of a connector according to another example.

FIG. 6 schematically represents such a structure of the male connectors 7a and 7b that these connectors are elastically deformed. A base portion 9a of a terminal pin 9 is connected to the print board 4 by solder 10, tip portions 9b thereof are bent inside and then press-inserted into the male connectors 7a and 7b, and further these male connectors 7a and 7b are supported by the array of the terminal pins 9 positioned opposite to each other. Then, spaces 13 are formed among the both side surfaces of the male connectors 7a, 7b, and the terminal pin 9, and these male connectors 7a and 7b are slightly displaceable along the arrow direction.

It should be noted that both of the female connectors 2a, 2b, and the male connectors 7a, 7b are not required to be displaceable, but either connector is displaceable.

It should also be noted that two connectors provided on both sides of the printed board need not be displaceable due to elastic deformation, but either one connector may be made displaceable. In this case, displacement of these two connectors along the interval direction becomes a half of that occurred when the two connectors are displaceable.

In the above-described embodiment, the male connectors 7a and 7b have been provided on the printed board 4 of the main body of the personal computer and the female connectors 2a, 2b have been provided on the printed board 1 for the extendible internal memory. Conversely, the female connectors 2a, 2b may be provided on the printed board 4 of the main body of the personal computer, and also the male connectors 7a, 7b may be provided on the printed board 1 of the extendible internal memory.

Although the connectors have such elastically deformable structures in the above-described embodiment, the present invention is not limited thereto. For example, the connectors per se may be so constructed that they are displaced on the printed board along the interval direction of the two connectors. This may be realized by that, for instance, the connectors are provided by way of an elastic member such as spring on the printed board in such a manner that these two connectors are displaceable along the interval direction of these connectors.

Figure 7:
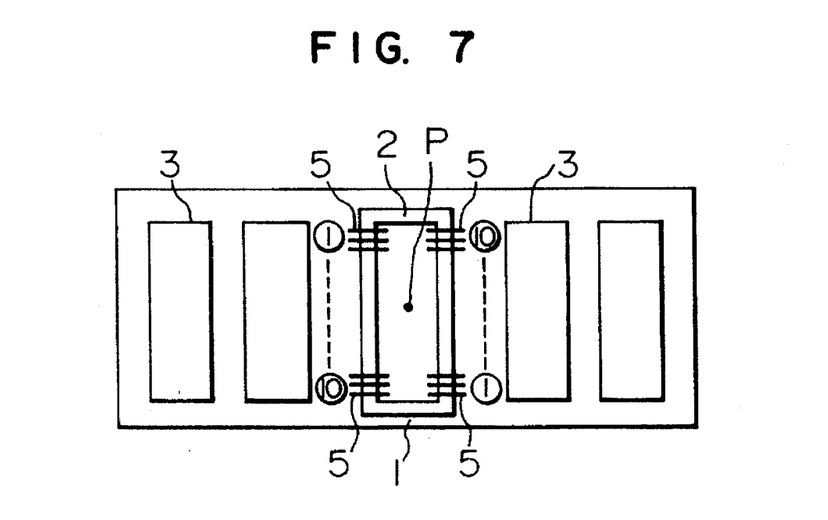
FIG. 7 is a bottom view of an extendible internal memory according to another example.

Although the female connectors 2a and 2b have been provided on both sides of the printed board 1 in the above-described embodiment, a single connector 2 may be provided at a substantially central portion of the printed board 1, as represented in FIG. 7, in case that the total number of the terminal pins 5 is relatively small. In this case, the array of the left-sided terminal pins 5 of the connector 2 is provided with the array of the right-sided terminal pins 5 in a point symmetry with respect to a central point "P" of this connector 2 as a base point.

Figure 8:
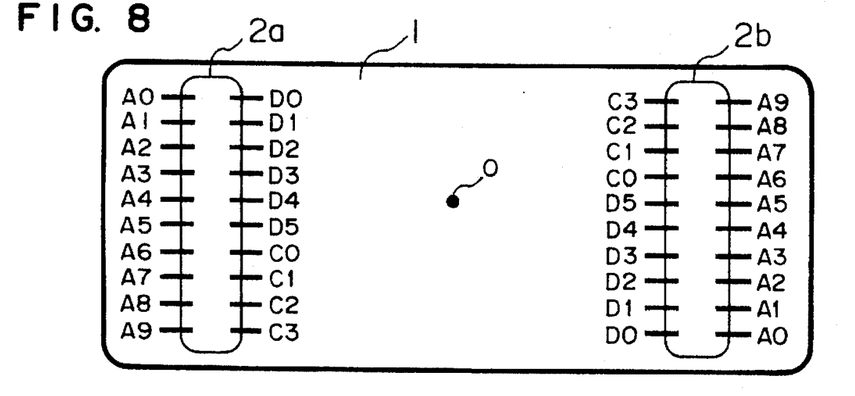
FIG. 8 is a bottom view for schematically indicating a concrete example of a pin arrangement of the extendible internal memory shown in FIG. 7.

FIG. 8 is a bottom view for representing one concrete example of a pin arrangement of an extendible internal memory. In this drawing, symbols A0 to A9 indicate address signals representative of address of data stored in the extendible internal memory, symbols D0 to D5 show data signals, and symbols C0 to C3 represent terminal pins for control signals used to control data read/write operations to the memory. The respective signal terminal pins are arranged in a point symmetry with respect to a center point 0 of the connectors 2a and 2b as a base point.

That is, even when the printed board of the extendible internal memory is connected along the direction opposite to the normal direction, since the same electric circuit is formed between this printed board 1 and the printed board 4 of the main body 11 for the personal computer, the printed board can be normally operated in a similar manner as if the printed board 1 of the extendible internal memory is connected to the printed board 4 along the normal direction.

Figure 9:
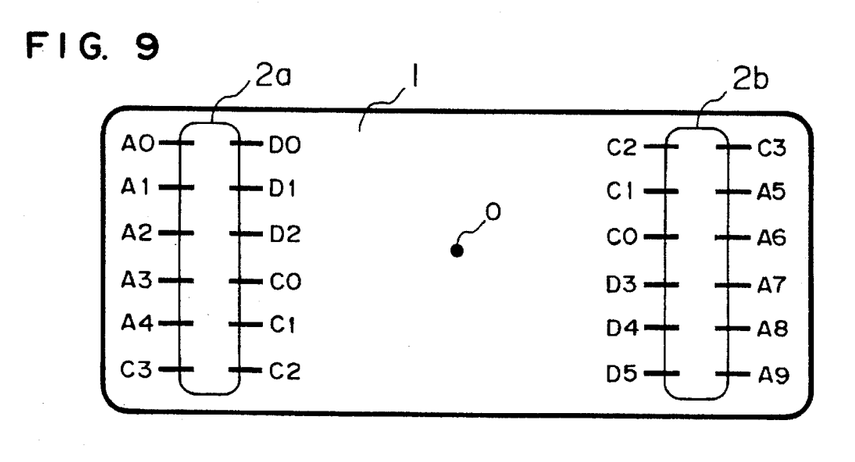
FIG. 9 is a bottom view for schematically showing another pin arrangement according to another example.

FIG. 9 is such another concrete example of the pin arrangement having a similar function to that of the above-explained pin arrangement shown in FIG. 8, and such an advantage that the total number of terminal pins is smaller than that of the above-explained terminal pins shown in FIG. 8. The address lines A0 to A9, and the data lines D0 to D5 are allocated to the terminal pins of the connectors 2a and 2b in a half portion thereof in a point symmetry with respect to the center point "0" as a base point. The control lines C0 to C3 are allocated to both of these connectors 2a and 2b with respect to the center point "0" as a base point.

When this printed board 1 is connected in the reverse direction, since the terminal pins C0 to C3 for the control signals are arranged in a point symmetry with respect to a central point "0" as a base point in a similar manner to that of FIG. 8, these terminal pins C0 to C3 for the control signals are connected to the terminal pins C0 to C3. To the contrary, the address signal terminals A0 to A4 and A5 to A9 of the printed board 1 are connected to the address signal terminals A9 to A5 and A4 to A0 of the circuit board 4 of the personal computer's main body, whereas the data signal terminals D0 to D2 and D3 to D5 of the printed board 1 are connected to the data signal terminals D5 to D3 and D2 to D0 of the circuit board 4 employed in the personal computer's main body.

Even when the combination sequence among the address lines and among the data lines is taken unwillingly, the data to be stored are coupled to the addresses of the stored data with keeping a one-to-one correspondence. As a consequence, since independence can be maintained, the circuit board shown in FIG. 9 can provide the completely equivalent function to that of the circuit board shown in FIG. 8.

In accordance with this embodiment, even when the combination sequence of the same series signals is not established in the normal order, which is similar to that of the address signals and the data signals, these same series signals having the equivalent functions are arranged to the terminal pins of the connectors 2a and 2b in a point symmetry with respect to a central point "0" as a base point in a half allocation manner. As a consequence, the total number of terminal pins can be reduced without destroying the objective that the printed board may be mounted along both of the normal direction and the reverse direction. That is, the total number of terminal pins employed in the connector shown in FIG. 8 is 40, whereas the total number of terminal pins employed in the connector indicated in FIG. 9 is 24, so that 16 terminal pins can totally be reduced.

Figure 10:
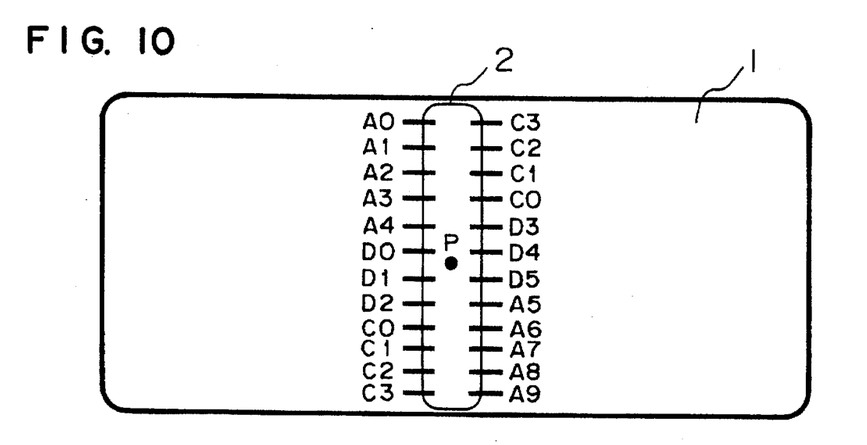
FIG. 10 is a bottom view for schematically representing a pin arrangement of another example by one connector.

In accordance with the above-described embodiment, the two connectors 2a, 2b are employed on both sides of the printed board 1, and the same sort of terminal pins 5 are provided on these two connectors in a half allocation manner such that even when the combination sequence of the address signal pins and the data signal pins is not established in the normal order, the equivalent function may be achieved. As a result, the total number of terminal pins can be reduced. In FIG. 10, there is shown another embodiment in which a similar function to that of the concrete example shown in FIG. 9 may be achieved with employment of a single connector, while the total number of terminal pins is reduced.

That is, a single connector 2 is provided on a printed board 1, and the same sort of terminal pins are provided in a point symmetry with respect to a central point "P" of the connector 2 as a base point, even when the combination sequence of the terminal pins is not established in the normal order, an equivalent function may be achieved. In other words, the address lines A0 to A9 and the data lines D0 to D5 are arranged in a point symmetry with respect to this central point "P" of the connector 2 as a base point in a half allocation manner, so that a similar advantage can be obtained with employing one connector.

Although the previous examples shown in FIGS. 4A and 4B represent that the respective terminals (1) to (3) own the different functions from each other, these terminals may be alternatively employed as terminals having the same function, for instance, when a plurality of power supply terminals are provided, or when not-in-use-terminals (which are not connected with any circuit) having no function are employed. In other words, even when the printed board 1 is mounted to the printed board 4 along either the normal direction, or the reverse direction, the electric circuits having the substantially same functions may be fabricated between these printed boards 1 and 4.

Although the extendible internal memory has been described in the above-described embodiments, the present invention is not limited thereto, but may be applied to various sorts of circuit boards used to extent functions thereof.

Also, there has been described in the above-explained embodiment that the extendible internal memory is connected via the connectors to the circuit board employed in the main body of the personal computer. However, the present invention is not limited to this example, but may be applied to such a case that a connector is merely formed on a case and the like.

Although the above-explained embodiment has described such a case that the two circuit boards are connected by way of the male connectors 7 and the female connectors 2, the present invention is not restricted thereto, but may be applied to an edge connector type circuit board such that terminals are arranged on edge portions of the printed board by way of a printed wire.

As previously described, in accordance with one aspect of the present invention, it is so arranged that a second circuit board can be mounted with respect to a first circuit board along not only the normal direction, but also the reverse (opposite) direction, and even when the second circuit board is mounted with regard to the first circuit board along either the normal direction, or the reverse direction, the first and second circuit boards can be operated under normal condition. As a result, the second circuit board can be mounted without paying an attention to the mounting direction thereof, whereby operabilities of these circuit boards can be improved. Conventionally, the mounting direction of the second circuit board with respect to the first circuit board must be considered while mounting the second circuit board on the first circuit board.

Since even when the second circuit board is mounted with respect to the first circuit board along either the normal direction, or the reverse direction, the normal electric circuit can be formed, and a protection circuit as employed in prior art is no longer required.

As previously explained, in accordance with another aspect of the present invention, it is so constructed that a second circuit board can be mounted with respect to a first circuit board along not only the normal direction, but also the reverse direction opposite to this normal direction, and even when the second circuit board is mounted with regard to the first circuit board along either the normal direction, or the reverse direction, the substantially same electric circuits can be formed between the first circuit board and the second circuit board. As a consequence, since the second circuit board is mounted on the first circuit board, so that at least two same electric circuits can be formed, even if either contact failure, or disconnection happens to occur in the contacts of one electric circuit, the other electric circuit can be normally operated, resulting in improved operation reliability.

As previously stated, in accordance with a still further aspect of the present invention, at least two connectors are employed in each of the first circuit board and the second circuit board, and then at least one connector employed in at least one of these first and second circuit boards is displaceable along the interval direction of the connectors. As a consequence, even when there is a slight positional shift in the connector mounting position and the component dimension, such a positional shift can be absorbed. Therefore, there is advantage that mechanical destruction of the connectors and contact failure of the connector pins can be prevented.

We claim:

1. A connection apparatus of a circuit board comprising a first circuit board, and a second circuit board prepared for said first circuit board which is detachably mounted via a connector only to said first circuit board, wherein:

said second circuit board can be mounted with respect to said first circuit board in a normal direction, or in a reverse direction opposite to said normal direction, and when the second circuit board is mounted with regard to the first circuit board along either said normal direction, or said reverse direction, said first and second circuit boards can be operated under normal conditions;

provided that when said second circuit board is mounted with respect to said first circuit board along either the normal direction, or the reverse direction, substantially the same electric circuits are formed between said first circuit board and said second circuit board, wherein at least two connectors are positioned in parallel to each other on said first circuit board, and terminal pins having the same pin arrangement order are provided in a point symmetry with respect to a center point between said connectors as a base point, and wherein at least two connectors fitted to said two connectors provided on said first circuit board are provided on said second circuit board, and terminal pins having the same pin arrangement order are provided on the second circuit board in a point symmetry with respect to a center point between said two connectors as a base point.

2. A connection apparatus of a circuit board as claimed in claim 1 wherein:

said first circuit board is a board for a computer, and said second circuit board is a board for an extendible internal memory.

* * * * *